(12) United States Patent
Oyama et al.

(10) Patent No.: US 8,304,889 B2
(45) Date of Patent: *Nov. 6, 2012

(54) POWER SEMICONDUCTOR MODULE AND FABRICATION METHOD THEREOF

(75) Inventors: Kazuhiro Oyama, Takahagi (JP); Mutsuhiro Mori, Mito (JP); Katsuaki Saito, Iwaki (JP); Yoshihiko Koike, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/732,238

(22) Filed: Mar. 26, 2010

(65) Prior Publication Data

US 2010/0176505 A1 Jul. 15, 2010

Related U.S. Application Data

(62) Division of application No. 11/762,276, filed on Jun. 13, 2007.

(30) Foreign Application Priority Data

Jun. 16, 2006 (JP) .................................. 2006-167267

(51) Int. Cl.
*H01L 23/538* (2006.01)
(52) U.S. Cl. ........ 257/692; 257/723; 257/678; 257/177; 257/178; 257/181; 257/182; 257/E25.016
(58) Field of Classification Search .................. 257/678, 257/177, 178, 181, 182, 180, 688, E25.03, 257/E25.016
See application file for complete search history.

(56) References Cited

U.S. PATENT DOCUMENTS

| | | | |
|---|---|---|---|
| 4,756,195 A | 7/1988 | Melton et al. | |
| 6,404,062 B1 | 6/2002 | Taniguchi et al. | |
| 6,421,244 B1 * | 7/2002 | Shinohara et al. | 361/736 |
| 6,881,071 B2 * | 4/2005 | Heilbronner | 439/67 |
| 2003/0173579 A1 * | 9/2003 | Ishii et al. | 257/177 |
| 2005/0001312 A1 | 1/2005 | Akram | |

FOREIGN PATENT DOCUMENTS

| | | |
|---|---|---|
| DE | 198 52 355 | 12/1999 |
| EP | 0 845 809 A2 | 6/1998 |
| JP | 2000-68446 | 3/2000 |
| JP | 2000068446 A * | 3/2000 |

OTHER PUBLICATIONS

Partial European Search Report; Application No. EP 07 01 1562; Date of Completion: Apr. 4, 2008.
Extended European Search Report issued in European Patent Application No. 10002938.8 on Feb. 9, 2011.

* cited by examiner

*Primary Examiner* — Junghwa M Im
(74) *Attorney, Agent, or Firm* — Antonelli, Terry, Stout & Kraus, LLP.

(57) ABSTRACT

An elastic printed board is provided so that stress applied by the silicon gel is absorbed by the printed board. Further, the printed board is formed to be so narrow that the stress can escape. On the other hand, the wires on which a high voltage is applied are patterned on respective printed boards. This serves to prevent discharge through the surface of the same printed board serving as a current passage. This design makes it possible to hermetically close the power module, prevent intrusion of moisture or contamination as well as displacement, transformation and cracks of the cover plate.

13 Claims, 15 Drawing Sheets

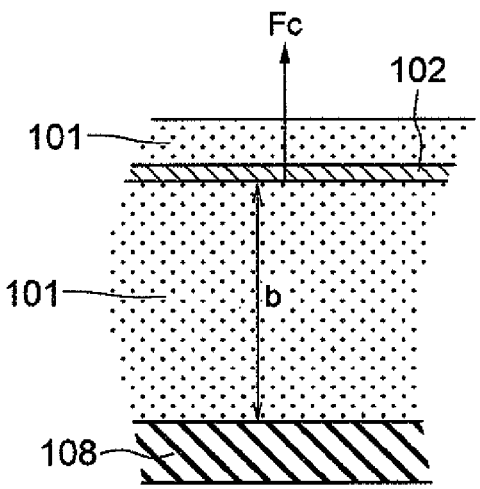
FIG. 8A
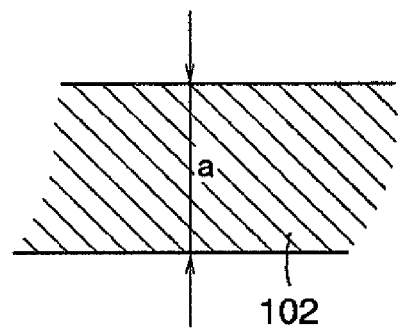
FIG. 8B
FIG. 9
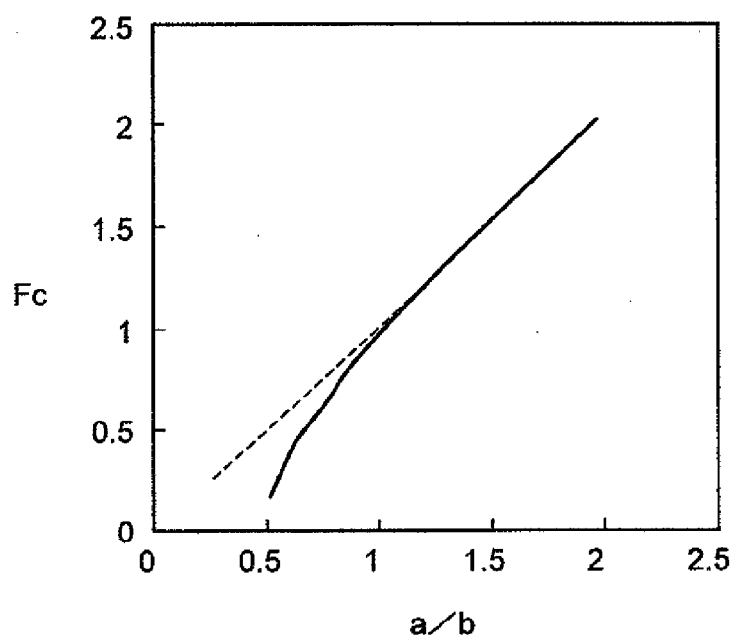

POWER SEMICONDUCTOR MODULE AND FABRICATION METHOD THEREOF

CROSS-REFERENCE TO RELATED APPLICATIONS

This application is a divisional of U.S. application Ser. No. 11/762,276, filed Jun. 13, 2007, and which application claims priority from Japanese application JP 2006-167267 filed on Jun. 16, 2006, the contents of which are hereby incorporated by reference into this application.

BACKGROUND OF THE INVENTION

The present invention relates to a power semiconductor module and more particularly to the highly pressure-resisting and reliable power semiconductor module having a main circuit, control wires and a control circuit built in a module package and the fabrication method of the power semiconductor module.

JP-A-2000-68446 discloses the structure of a power module on which a power semiconductor module is mounted, in which structure a main circuit, control wires and a control circuit are built in a module package.

FIG. 18 shows the structure of the power semiconductor module disclosed in FIG. 1 of the foregoing JP-A-2000-68446. In this structure, an insulating substrate 18 is soldered on a copper base 17 and semiconductor chips 19 are soldered on the substrate 18. The semiconductor chips 19 are connected with electrode patterns (not shown) by Al wires 20. Further, a printed board 13 having a component 14 for a control circuit mounted thereon and composing the control circuit is located above the insulating substrate in a two-tired manner and a lead pin 15 is electrically connected between the printed board 13 and the insulating substrate 18. The printed board 13 is directly soldered with a control terminal 21a inside thereof. siliconegel 12 served as a sealing material is filled so that the siliconegel covers the component for a control circuit on the printed board, the lead pin 15, the inner portion of the inside control terminal 21a and then is hot-cured. A numeral 16 denotes a lower printed board, a numeral 21 denotes a control terminal, a numeral 22 denotes a main terminal, a numeral 23 denotes a case, and a numeral 23c denotes a supporter located in the case. Further, a cover plate 10 is located on the upper surface of the module so that a gap is formed between the cover plate 10 and the silicone gel 12. Inside of the cover plate 10 is provided a projection 11 that serves to suppress the upper control board 13 downwardly. The cover plate 10 is required to be made of a material being resistive to a tracking fire, such as polyphenylene sulfide (PPS).

SUMMARY OF THE INVENTION

By applying a heat cycle to the module structured as disclosed in JP-A-2000-68446, the thermally expanded silicone gel 12 is displaced upwardly. The coefficient of thermal expansion is greater than that of any other component by about one digit. The expansion is conducted to the printed board 13, so that the printed board 13 may be greatly displaced. The displacement is conveyed to the cover plate 10 through the projection 11. Hence, the cover plate 10 is greatly displaced, which leads to the great transformation of the cover plate 10. To make the cover plate 10, a fragile material such as polyphenylene sulfide (PPS) has small yield stress and is likely to be broken even by small transformation. Hence, the cover plate 10 is cracked. Then, the outside moisture and the contamination are intruded into the module through the crack, so that the inside is contaminated. That is, the power module loses its airtightness. The loss of the airtightness brings about some shortcomings such as degrade of voltage endurance, which causes discharge in the module, characteristic variation of the semiconductor chip.

It is an object of the present invention to provide a highly reliable power semiconductor module which prevents degrade of voltage endurance of the power semiconductor module and characteristic variation of a semiconductor chip.

It is another object of the present invention to provide a method of fabricating a highly reliable power semiconductor module which prevents degrade of voltage endurance of the power semiconductor module and characteristic variation of a semiconductor chip.

The basic concept of the present invention is to absorb stress given from the silicone gel by transformation of the printed board, the stress having been applied by the printed board and conveyed to the silicone gel through the projection.

According to one aspect of the invention, a power semiconductor module includes a printed board having a power circuit portion having power semiconductor chips located on top of the base with a case therearound, circuit components mounted above the power circuit portion with a spacing therebetween, supporters for connecting the printed board with a cover plate located on top of the case, and silicone gel being filled in the module itself and has a structure in which the printed board is transformable according to expansion/contraction of the silicone gel in a heat cycle and the stress applied by the silicone gel is absorbed by the printed board.

According to an aspect of the invention, the material of the overall or partial surface of the printed board has a smaller elastic coefficient than that of the material of the cover plate.

According to a further aspect of the invention, the thickness of all or part of the printed board is smaller than that of the cover plate.

According to a yet further aspect of the present invention, the printed board is made of glass epoxy FR4 and the thickness of the printed board is equal to or smaller than 2 mm.

According to another aspect of the invention, the printed board is made of a flexible printed circuit film.

A preferable embodiment of the present invention provides a highly reliable power semiconductor module which prevents degrade of voltage resistance of the power semiconductor module and characteristic variation of the semiconductor chip.

A further preferable embodiment of the present invention provides a method of fabricating the highly reliable power semiconductor module which prevents degrade of voltage resistance of the semiconductor power module and characteristic variation of the semiconductor chip.

The other objects and the features of the present invention will be apparent from the embodiments to be described below.

Other objects, features and advantages of the invention will become apparent from the following description of the embodiments of the invention taken in conjunction with the accompanying drawings.

BRIEF DESCRIPTION OF THE DRAWINGS

FIGS. 8A and 8B are model explanatory views showing a filing depth of silicone gel under the printed board located in the power semiconductor module of the present invention, a width of the printed board, and stress applied from the gel of the printed board;

FIG. 9 is a graph showing relation between a ratio of a filling depth of silicone gel under the printed board to a width of the printed board and stress applied from the gel of the printed board in the power semiconductor module of the present invention;

DETAILED DESCRIPTION OF EMBODIMENTS

Hereafter, the description will be oriented to the power semiconductor module and the fabrication thereof according to the embodiments of the present invention.

First Embodiment

Figure 1:
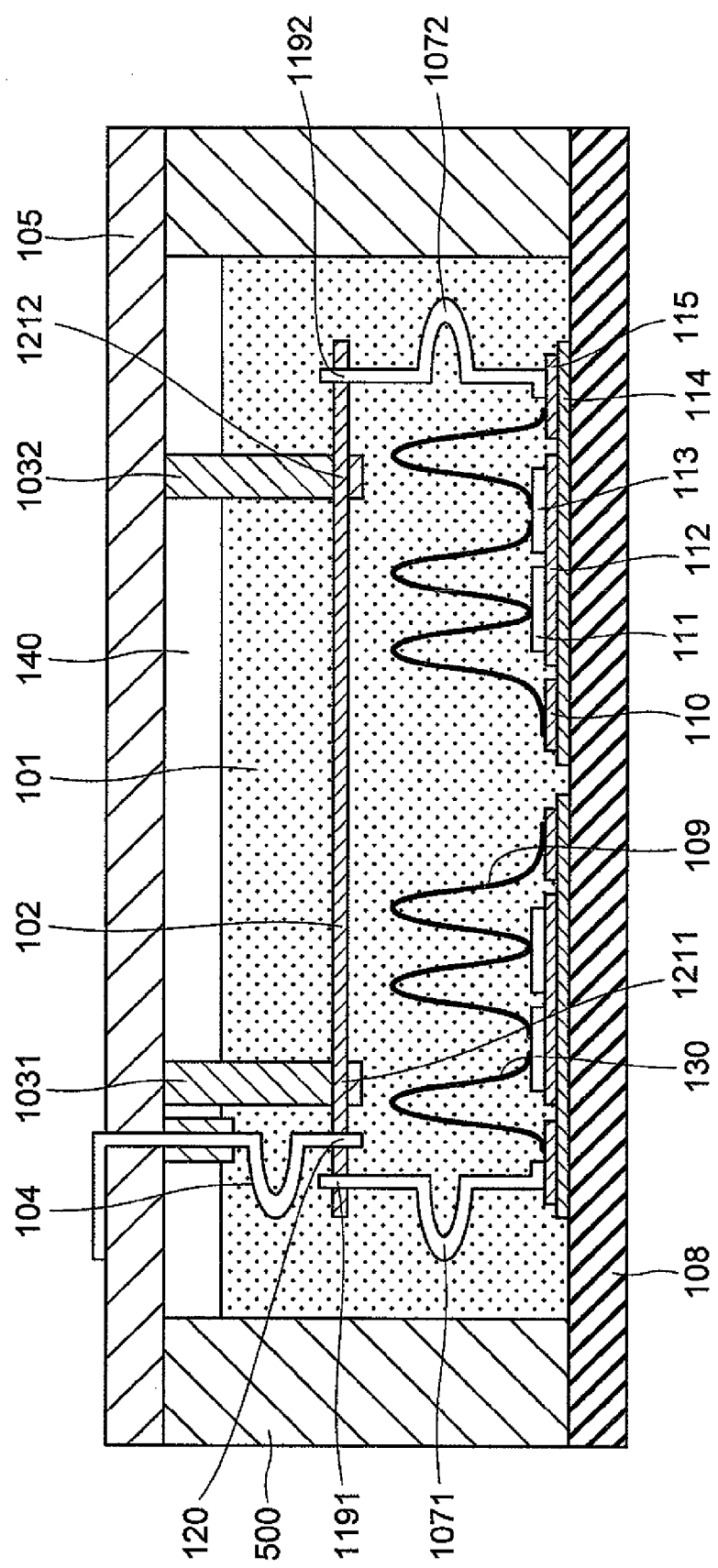
FIG. 1 is a sectional model view showing a power semiconductor module according to a first embodiment of the present invention.
Figure 2:
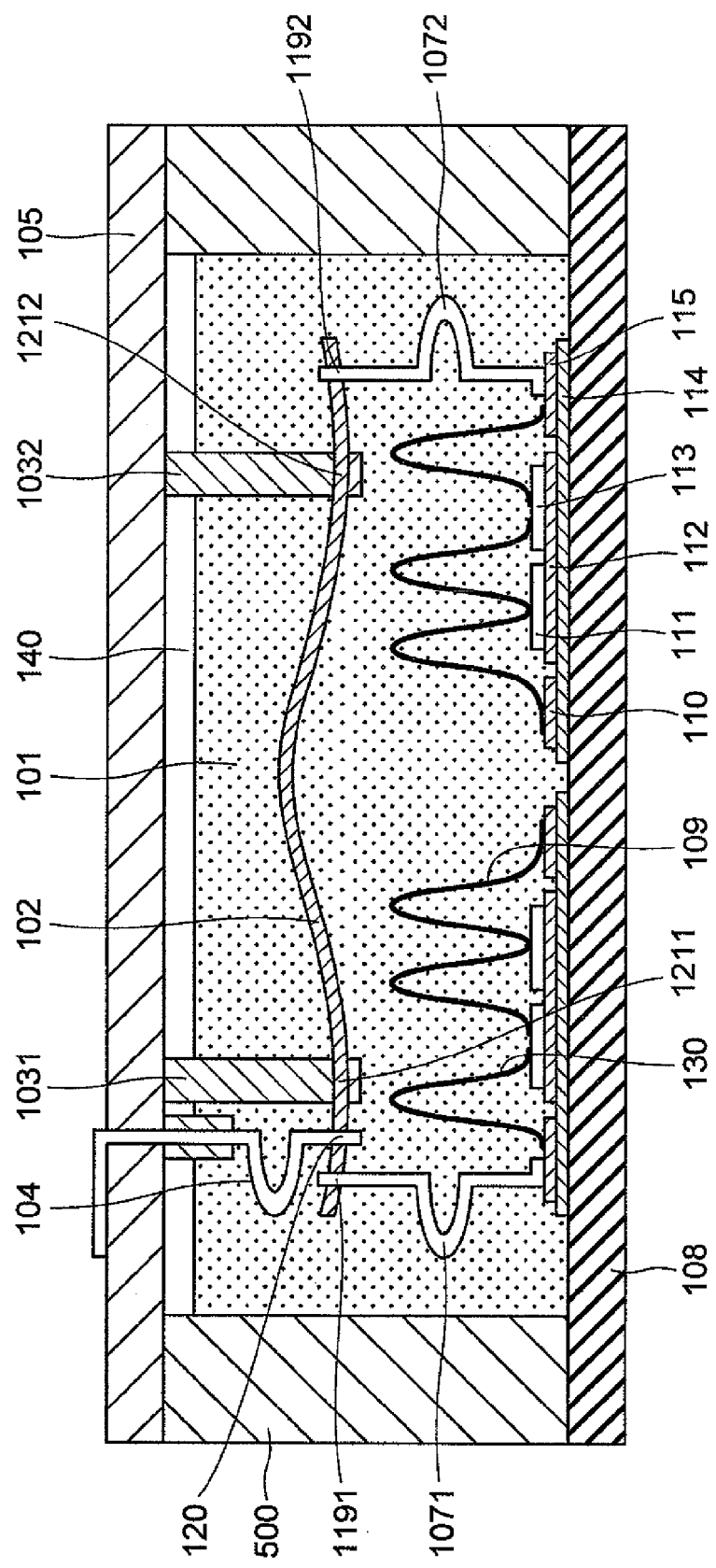
FIG. 2 is a sectional view of a power module for describing the effect of FIG. 1 after applying a heat cycle.

FIG. 1 is a sectional model view showing a power semiconductor module according to a first embodiment of the present invention. FIG. 2 is a sectional model view showing the power semiconductor module according to the first embodiment of the present invention provided after applying a heat cycle. In FIGS. 1 and 2, an insulating substrate 114 is mounted on a base 108. On the insulating substrate 114 are patterned a conductor 112 for connecting a main terminal, a conductor 115 for connecting a control terminal, and a conductor 110 for connecting the main terminal and the control terminal. On the conductor 112 for the main terminal are mounted an IGBT chip 113 and a diode chip 111. A bonding wire 109 connects the IGBT chip 113 with the diode chip 111 and then leads to the conductor 110 for the control terminal. A wire for connecting the control terminal bonds the IGBT chip 113 with the conductor 115 for connecting the control terminal. Bent control terminal 1071 and 1072 connect the conductor 115 for connecting the control terminal with the connections 1191 and 1192 of the wire formed on the elastic printed board 102. A case and a cover plate 105 surround the module so that they seal the inside of the module. Supporters 1031 and 1032 extending from the cover plate 105 serve to hold the printed board 102 being more transformable at supporting portions 1211 and 1211 and 1212 of the printed board. One end of the bent control terminal 104 is connected with the printed board 102 at its connection 120 and the other end of the bent control terminal 104 extends through the case and cover plate 105 and out of the module. All the terminals and the printed board are sunk in the hot-cured silicone gel 101 though a gap 140 is left under the cover plate 105. The main terminals such as a collector and an emitter extend from the outside of the module and connect with the conductor 112 for connecting the main terminal and the conductor 110 for connecting the main terminal and the control terminal. However, since those main terminals are not directly concerned with the present invention, those are not illustrated in FIG. 1.

In general, the volume expansion coefficient of the silicone gel is about 1000 ppm/K. It means that when the height of the silicone gel in the module is 20 mm, if the temperature change of +100° C. takes place, the silicone gel is thermally expanded heightwise by 2 mm.

When the silicone gel is displaced heightwise by applying a high temperature, the printed board 102 is displaced upward according to the displacement. The upward displacement is conveyed to the supporters 1031 and 1032 so that the cover plate 105 is placed. As a result, the cover plate 105 is displaced. On the other hand, the cover plate 105 is required to be made of a material being resistible to tracking fire. For example, the cover plate 105 is made of polyphenylene sulfide (PPS) resin. This is a fragile material and thus is low in yield stress. Hence, the cover plate made of this material is easily cracked even by the small displacement. As a result, the cover plate 105 is cracked and thus no longer hermetically seals the module. The break of the hermetical sealing brings about some shortcomings such as characteristic variation.

The power semiconductor module of the first embodiment is characterized in that the printed board 102 is more transformable than the cover plate 105. When the module shown in FIG. 1 is heated up in the process of a power cycle, as shown in FIG. 2, the filled silicone gel 101 is expanded toward the gap 140. Since the printed board 102 being more transformable than the cover plate 105 is transformed as shown in FIG. 2, the stress applied by the silicone gel 101 is absorbed by the printed board 102. As a result, the supporters 1031 and 1032 and the cover plate 105 are less displaced, so that the crack of the cover plate 105 is prevented.

This prevention is achieved by making the elastic coefficient of the printed board 102 smaller than that of the cover plate 105. Or, the prevention is also achieved by making the thickness of the printed board 102 smaller than that of the cover plate 105. Further, by using both of the designs, the effect is made far greater. In particular, when the printed board 102 is made of glass epoxy FR4, by making the thickness of the printed board 102 equal to or less than 2 mm, the effective result was found. Instead, it is possible to use the flexible printed circuit film for making the printed board 102. They are served respectively or in concert for the purpose of enhancing the effect of preventing the crack of the cover plate 105.

Figure 3:
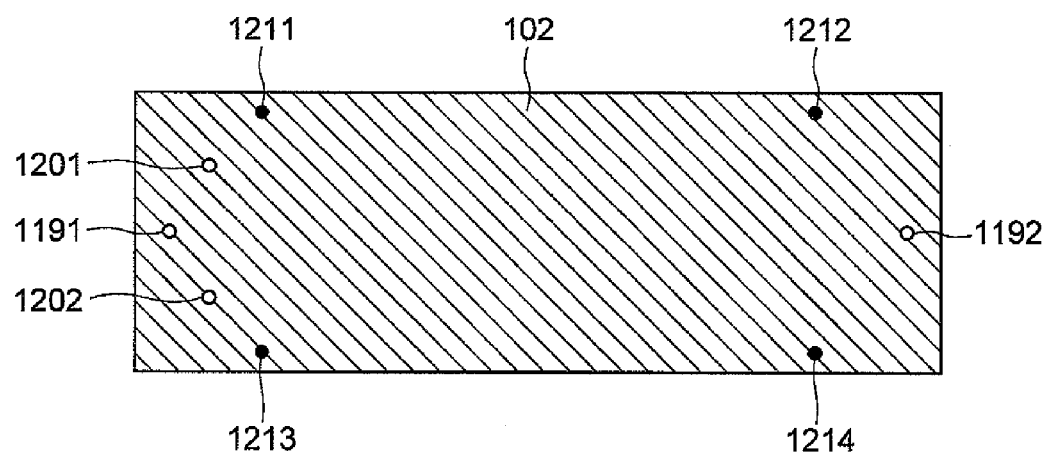
FIG. 3 is a plan view showing a first embodiment of a preferable printed board to be used for the first embodiment of the present invention.

FIG. 3 is a plan view showing the first embodiment of a preferable printed board to be used for the first embodiment of the present invention. This embodiment is characterized in that the connections 1191, 1192, 1201 and 1202 of the wires are located relatively closer to the supporters 1211 to 1214 on the printed board 102. This design makes it possible to reduce the displacements of the connections 1191, 1192, 1201 and 1202 of the wires, thereby being able to prevent the fatigue of the connections. This structure makes it possible to eliminate the necessity of the bent form of the control terminal 104, 1071 or 1072, which leads to reduction of the cost of the component.

Figure 4:
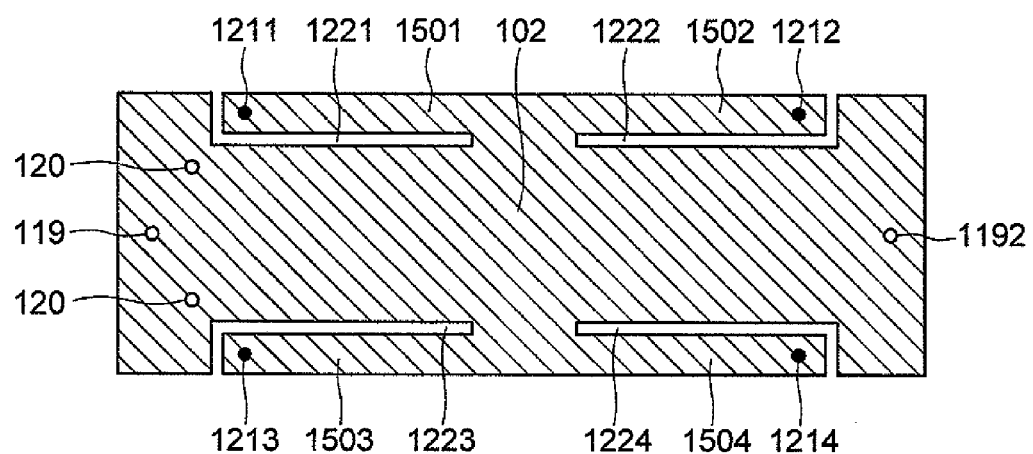
FIG. 4 is a plan view showing a second embodiment of a preferable printed board to be used for the first embodiment of the present invention.

FIG. 4 is a plan view showing a second embodiment of a preferable printed board to be used for the first embodiment of the present invention. This embodiment is characterized in that in addition to the structure of the embodiment shown in FIG. 3, the slits 1221 to 1224 are formed. Junctional portions 1501 to 1504 between the supporting portions 1211 to 1214 and the printed board 102 are more likely to be bent. Hence, the printed board 102 is more displaced. It means that the stress applied onto the supporters 1031 and 1032 shown in FIGS. 1 and 2 is made smaller and thus the cover plate 105 is less displaced, so that the cover plate 105 is hardly cracked. In this design, it is preferable to use the bent form for the foregoing control terminals 104, 1071 and 1072 as shown in FIGS. 1 and 2.

Figure 5:
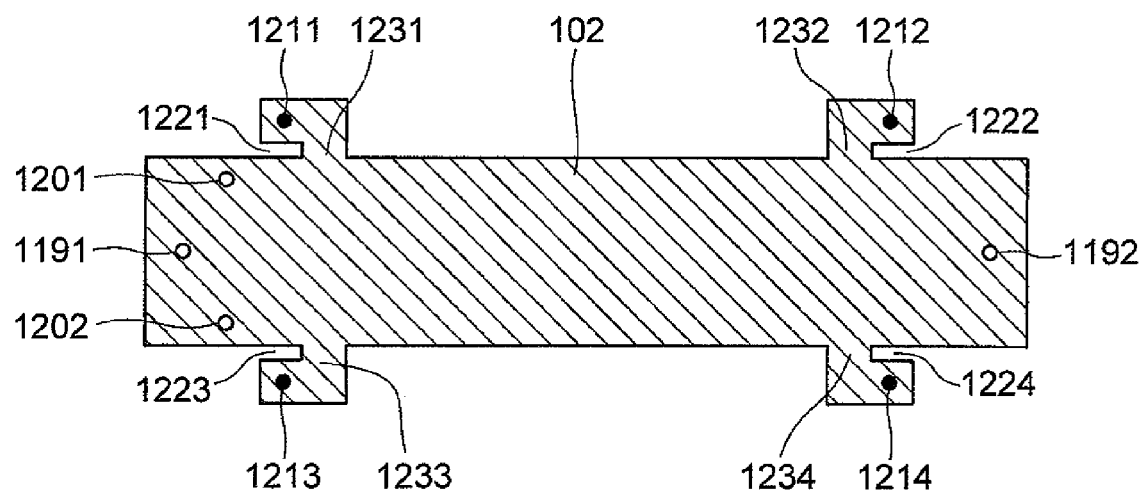
FIG. 5 is a plan view showing a third embodiment of a preferable printed board to be used for the first embodiment of the present invention.

FIG. 5 is a plan view showing a third embodiment of a printed board that may be suitably applied to the first embodiment of the present invention. This embodiment of the printed board is characterized in that the connecting portions 1231 to 1234 led from the supporting portions 1211 to 1214 to the printed board 102 are narrowed by the slits 1221 to 1224 respectively. Hence, the connecting portions 1231 to 1234 led from the supporting portions 1211 to 1214 to the printed board 102 are more likely to be bent than the design of the second embodiment shown in FIG. 4. This design thus makes it possible to more greatly displace the printed board 102 and reduce the area of the printed board 102, thereby making the load applied onto the printed board 102 smaller. As a result, the stress added onto the supporters 1031 and 1032 shown in FIGS. 1 and 2 is made smaller and thus the cover plate 105 is less transformed, which more prevents the cover plate 105 from being cracked. In this design, it is preferable to bend the foregoing control terminals 104 1071 and 1072 as shown in FIGS. 1 and 2.

Second Embodiment

Figure 6:
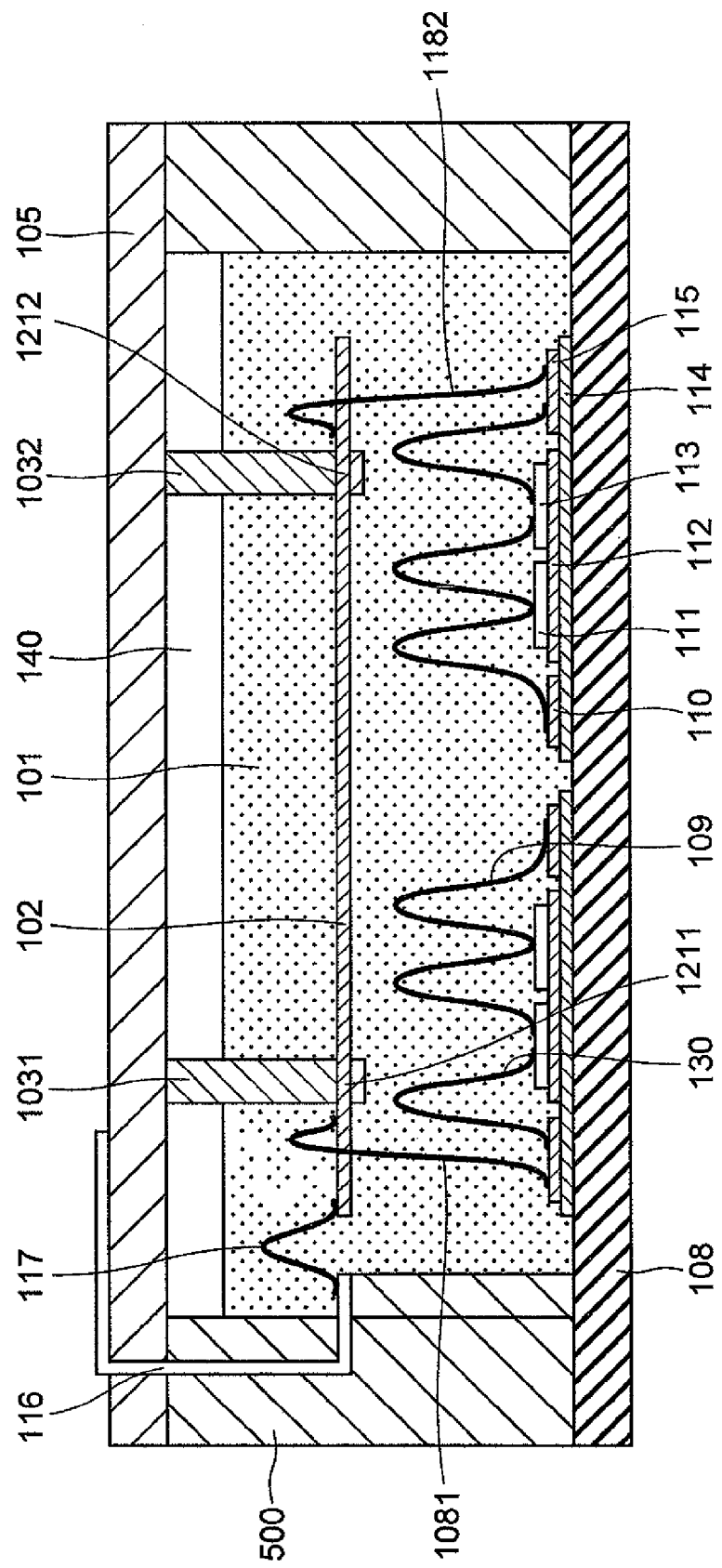
FIG. 6 is a sectional model view showing a power semiconductor module according to a second embodiment of the present invention.

FIG. 6 is a sectional model view showing a power semiconductor module according to a second embodiment of the present invention. The second embodiment is characterized in that bonding wires 1181 and 1182 are used for connecting the conductors 115 for connecting the control terminal with the wiring pattern on the printed board 102 and a bonding wire 117 is used for connecting the wiring pattern on the printed board 102 with the control terminal 116.

This embodiment is effective in improving the reliability of the power semiconductor module in a power cycle if the printed board 102 is greatly displaced.

Figure 7:
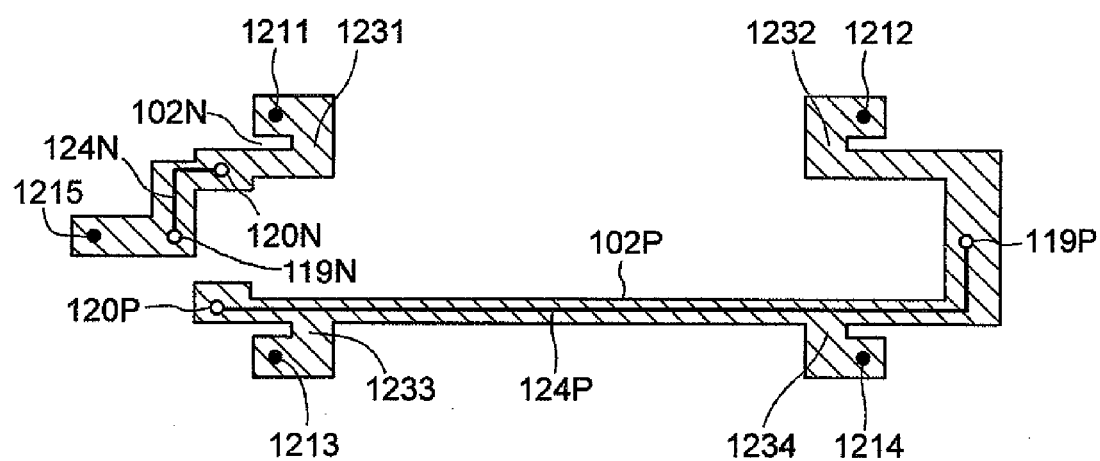
FIG. 7 is a plan view showing a fourth embodiment of a preferable printed board to be used for the power module of the present invention.

FIG. 7 is a plan view showing a fourth embodiment of the printed board that may be preferably applied to the power semiconductor module according to the present invention. Before describing the fourth embodiment, the relation among a width a of the printed board, a filling depth b of silicone gel located under the printed board 102, and a load Fc applied onto the printed board will be described with reference to FIGS. 8 and 9.

FIGS. 8A and 8B show the definitions of the width a of the printed board, the filling depth b of the silicone gel, and the load Fc applied onto the printed board. FIG. 8A is a sectional view of the module and FIG. 8B is a top view of the printed board.

FIG. 9 is a graph showing relation between a ratio (a/b) of the width a of the printed board to the filing depth b of the silicone gel and the load Fc, in which graph the load Fc is normalized in the condition that the load Fc is 1 when a/b=1.

As shown in FIG. 9, as the width a of the printed board 102 is made narrower as compared with the filling depth b of the silicone gel 101, the load Fc is being gradually reduced. That is, it was revealed by the inventors and the like that when a/b is equal to or less than 1, the load Fc shows the critical level, that is, the load Fc is shifted out of the proportional relation indicated when a/b is greater than 1 and is started to be reduced.

Turning back to FIG. 7, the fourth embodiment of the printed board composed to use the foregoing feature is shown in a plan view. This fourth embodiment is characterized in that the printed board is divided into the parts 102P and 102N and the width of the divided printed board 102P or 102N is adjusted so that a/b is equal to or less than 1. In this design, the load Fc applied onto the printed board is small so that the displacement and the transformation of the cover plate 105 are made smaller. This far more prevents the cover plate 105 from being cracked.

Figure 10:
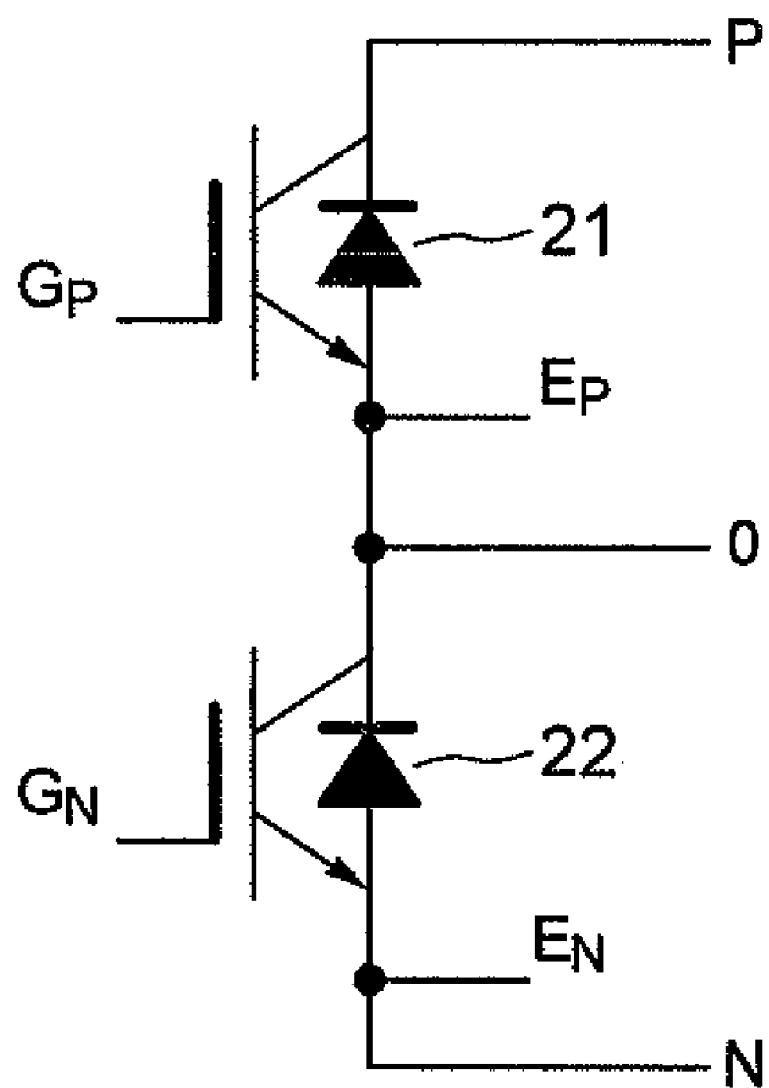
FIG. 10 is a circuit diagram showing a two-element integral type power semiconductor module to which the present invention may be applied.

Further, in this embodiment, the printed board is divided into the parts 102P and 102N, the former of which provides a wire 124P for connecting the connecting portions 120P with 119P and the latter of which provides a wire 124N for connecting the connecting portions 120N with 119N. When a high voltage is applied onto the different wires on the printed board to which conductive contamination adheres, disadvantageously, the surface of the printed board is served as a current passage so that discharge may be brought about on the surface thereof. In this embodiment, even if a high voltage is applied between the wires 124P and 124N, no discharge passage exist on the surface of the printed board. This serves to prevent degrade of resistance to voltage FIG. 10 is a circuit diagram showing a two-element integral type power semiconductor module to which the present invention may be applied. In this module, the P-side and the N-side power switching elements 21 and 22 are connected in series in a manner that a high voltage is applied between both of the sides. Each switching element provides a diode built therein. P, N and O denote main electrodes through which large current passes. GP, EP and GN, EP denote switching control terminals.

Figure 11:
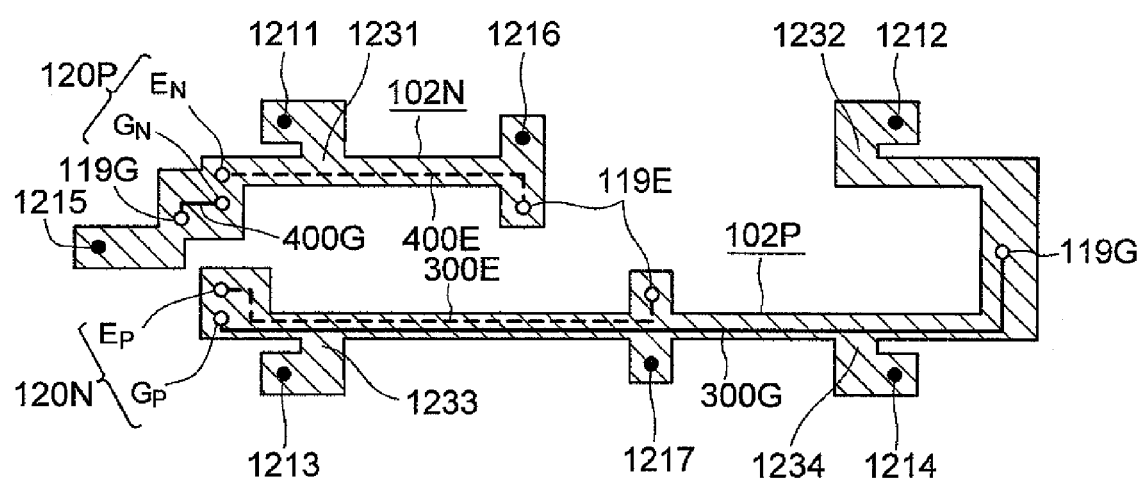
FIG. 11 is a plan view showing the printed board of the fifth embodiment of the invention that is preferable to the diagram of FIG. 10.

FIG. 11 is a plan view showing a fifth embodiment of the printed board that may be preferably applied to the power semiconductor module shown in FIG. 10. In this embodiment, the printed board is divided into the part 102P on which control wires 300G and 300E for controlling the P-side power element 21 shown in FIG. 10 are patterned and the part 102N on which a gate wire 400G and an emitter wire 400E for controlling the n-side power element 22 are patterned. In operation, though a high voltage is applied between the wires patterned on the printed board 102P and the wires patterned on the printed board 102N, since no discharge passage exist on the surface of the printed board, the degrade of resistance to voltage can be prevented. The power semiconductor chips 300G, 300E or 400G, 400E may be patterned on one surface of the printed board or the different surfaces thereof. If the wires of the chips 300G and 300E are patterned on the respective sides of the printed board and the wires of the chips 400G and 400E are patterned on the respective sides thereof, it is preferable, because this patterning makes contribution to reducing the mutual inductance.

Further, the module may be designed so that a ratio (a/b) of the width a of the printed board to the filling depth b of the silicone gel located under the printed board may be a/b is equal to or less than 1. This design makes it possible to reduce the load Fc applied by the silicone gel onto the printed board, thereby being able to lower a possibility of cracking the cover plate 10 and prevent the characteristic variation caused by contamination.

If the printed board designed as described above is used as the control wires of the two-element integral type power semiconductor module shown in FIG. 10, the resulting power module is low in characteristic variation and degrade of resistance to voltage and thus highly reliable.

Figure 12:
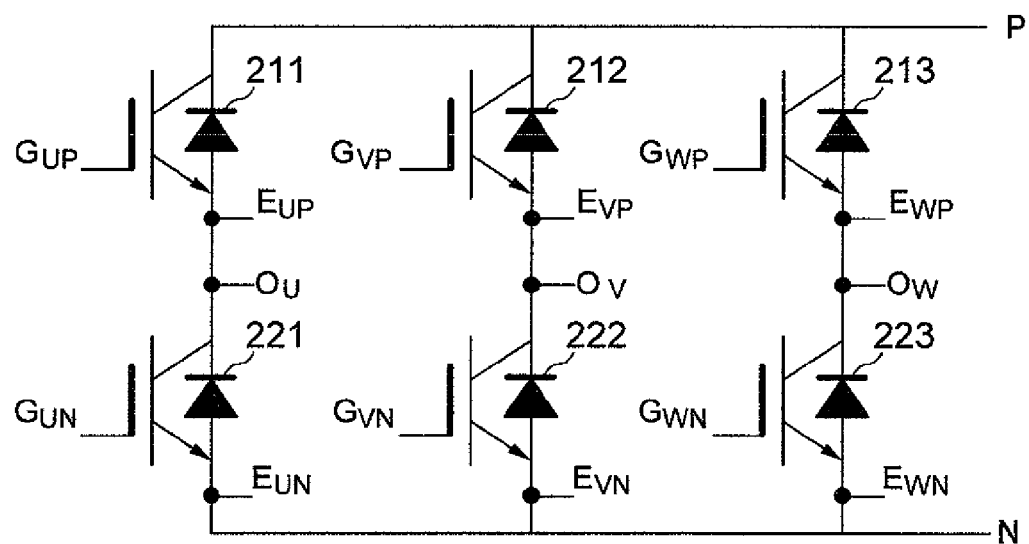
FIG. 12 is a circuit diagram showing a six-element integral type power semiconductor module to which the present invention may be applied.

FIG. 12 is a circuit diagram showing a six-element integral type power semiconductor module to which the embodiment of the present invention may be applied. This module is designed so that a high voltage is applied between the P-side power elements 211 to 213 and the N-side power elements 221 to 223 as well as among the U phases to the W phases. P, N and O denote main electrodes through which large current passes. G and E denote control terminals through which a signal for controlling the power elements is conveyed. These electrodes and terminals include the corresponding subscripts with the ac U to W phases and the dc P and N poles.

Figure 13:
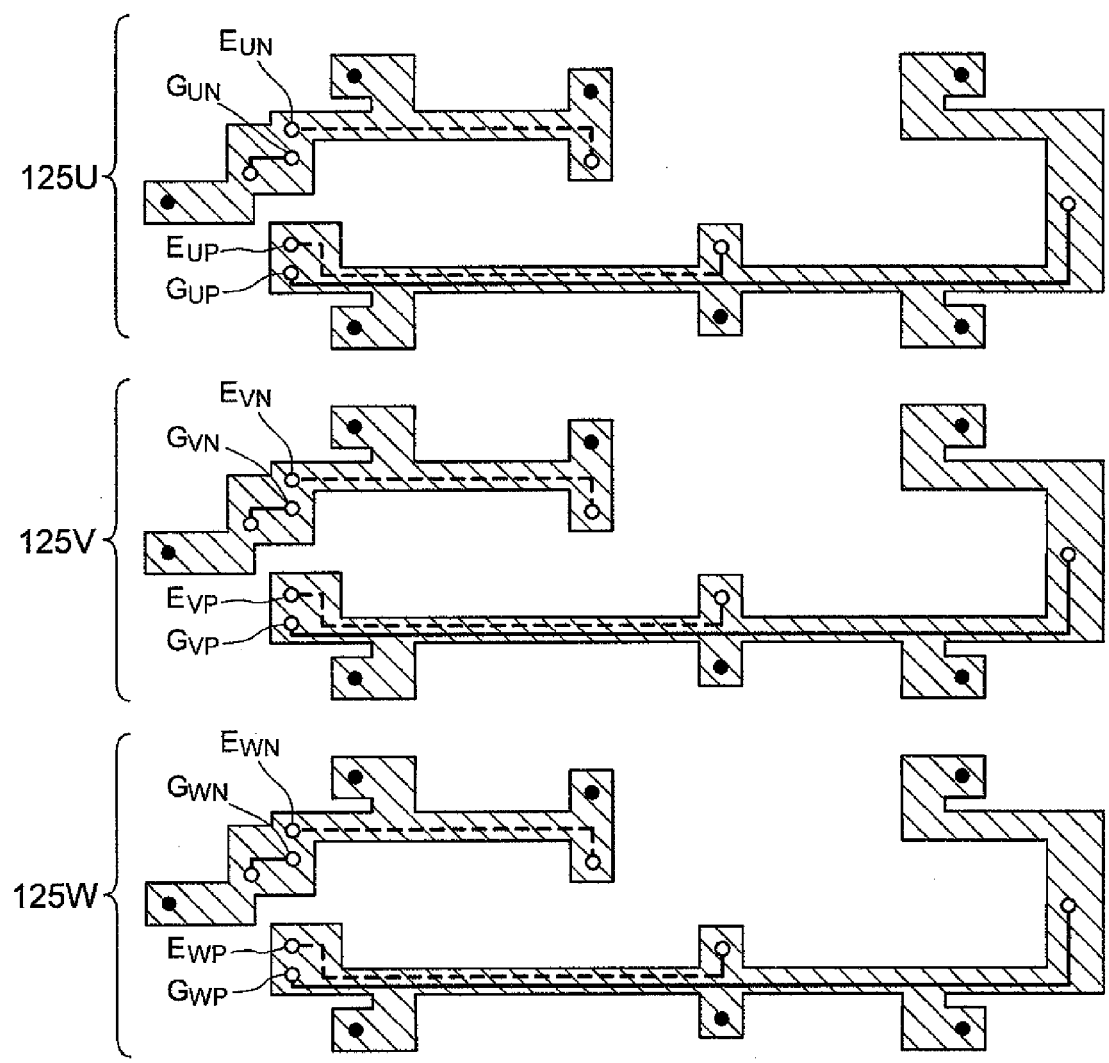
FIG. 13 is a plan view showing the printed board of the fifth embodiment of the invention that is preferable to the diagram of FIG. 12.

FIG. 13 is a plan view showing a sixth embodiment of the printed board that may be preferably applied to the semiconductor power module shown in FIG. 12. 125U, 125V and 125W are printed boards on which the U phase control wire, the V phase control wire and the W phase control wire are patterned respectively. This sixth embodiment is characterized in that the U phase printed board 125U, the V phase printed board 125V and the W phase printed board 125W are separated from one another. In operation, a high voltage is applied between these printed boards 125U, 125V and 125W. However, no charge passage exists on the surface of the printed board, so that the degrade of the resistance to voltage can be prevented.

Further, the module may be designed so that a ratio (a/b) of the width a of the printed board to the filling depth b of the silicone gel may be equal to or less than 1. This design makes it possible to reduce the load applied by the silicone gel onto the printed board and thereby to lower a possibility of cracking the cover plate 105 and to prevent the characteristic variation caused by contamination.

If the printed board designed as described above is used for the control wires of the six-element integral type power semiconductor module shown in FIG. 12, the resulting power module is low in characteristic variation and degrade of resistance to voltage and thus highly reliable. This embodiment may be widely used in both of an inverter and a converter. Then, the application of this embodiment to the inverter system will be described below.

Figure 14:
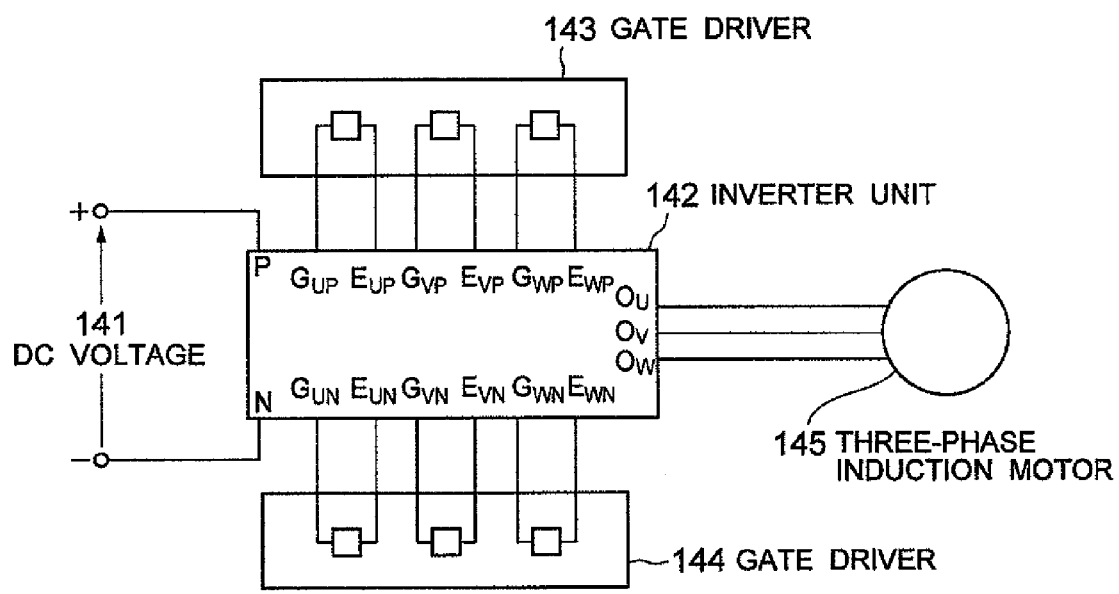
FIG. 14 is a diagram showing a variable speed drive unit for an ac motor to which the embodiments of the present invention may be applied.

FIG. 14 is a diagram showing a variable speed drive unit of an ac motor to which the embodiment of the present invention may be applied. An inverter unit 142 is one of the power converters fed from a dc power source 141 and operates to supply a three-phase alternate current of a variable voltage and a variable frequency to a three-phase inductor motor 145 under the control of the control unit (gate drivers) 143 and 144. Herein, the inverter unit 142 is an application of the embodiment of the present invention shown in FIGS. 12 and 13. The use of the power semiconductor module according to the embodiment of the present invention makes it possible to fabricate a highly reliable inverter unit.

The use of the power converter unit fabricated by applying the embodiment of the present invention makes it possible to enhance the reliability of a vehicle drive unit or the like with an electric power as its power source. In particular, the use of the six-element integral type power semiconductor module shown in FIG. 12 makes it possible to reduce the inverter unit 142 in size and weight and thus the vehicle drive unit in weight.

Third Embodiment

Figure 15:
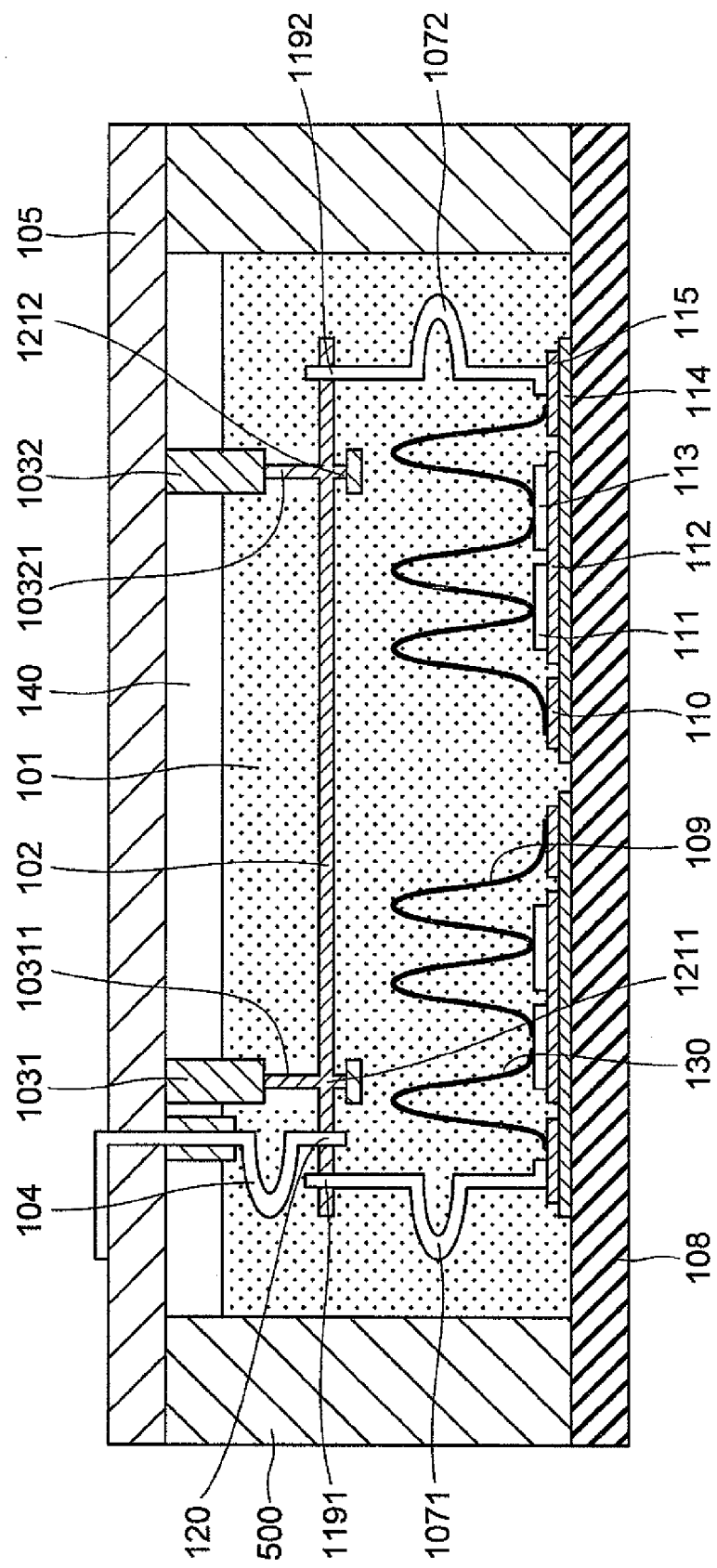
FIG. 15 is a sectional model view showing a power semiconductor module according to a third embodiment of the present invention.

FIG. 15 is a sectional model view showing a power semiconductor module according to the third embodiment of the present invention. The third embodiment is characterized in that part or all of each supporter 1031 or 1032 is made thin as shown by 10311 and 10321 so that the printed board 102 may be moved vertically on the thin supporter served as a guide rail. That is, the supporters 1031 and 1032 movably supports the printed board 102 longitudinally. Hence, the printed board 102 is moved vertically according to expansion or shrinkage of the silicone gel 101. However, the displacement is not conveyed to the supporters 1031 and 1032. This leads to reducing the displacement of the cover plate 104 and thereby preventing the crack of the cover plate 104.

Fourth Embodiment

Figure 16:
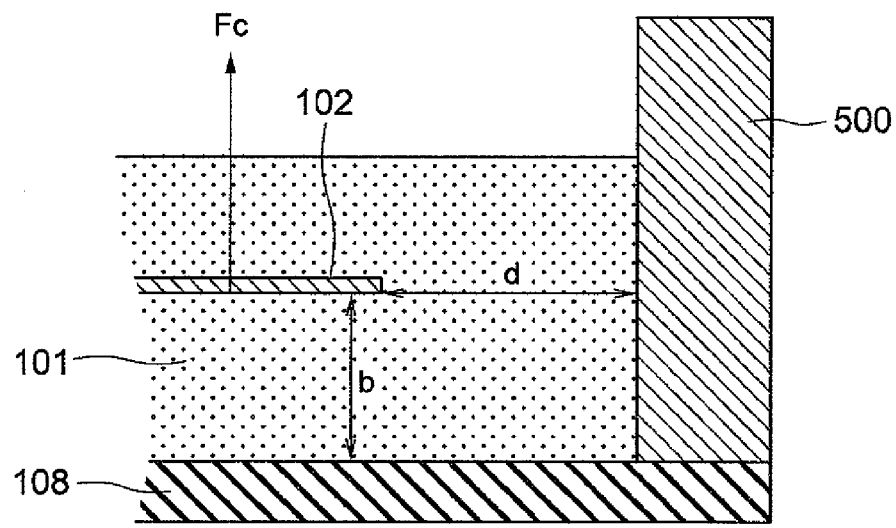
FIG. 16 is a partial sectional model view showing a power semiconductor module according to a fourth embodiment of the present invention.

FIG. 16 is a partially sectional model view showing a power semiconductor module according to a fourth embodiment of the present invention. This figure shows the definitions of a filling depth b of the silicone gel 101 under the printed board 102, a distance d between the end of the printed board 102 and the inner wall of the case 500, and a load Fc applied upwardly onto the printed board 102. This fourth embodiment will be described with reference to FIG. 17.

Figure 17:
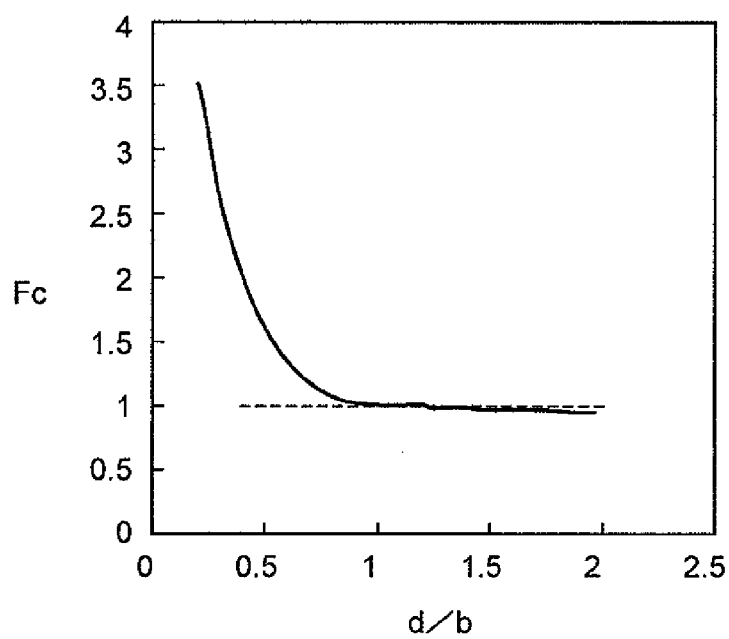
FIG. 17 is a graph showing relation a ratio (d/b) of a distance d between an end of the printed board 102 and an inner wall of the case and a filling depth b of the silicone gel under the printed board and a load Fc.
Figure 18:
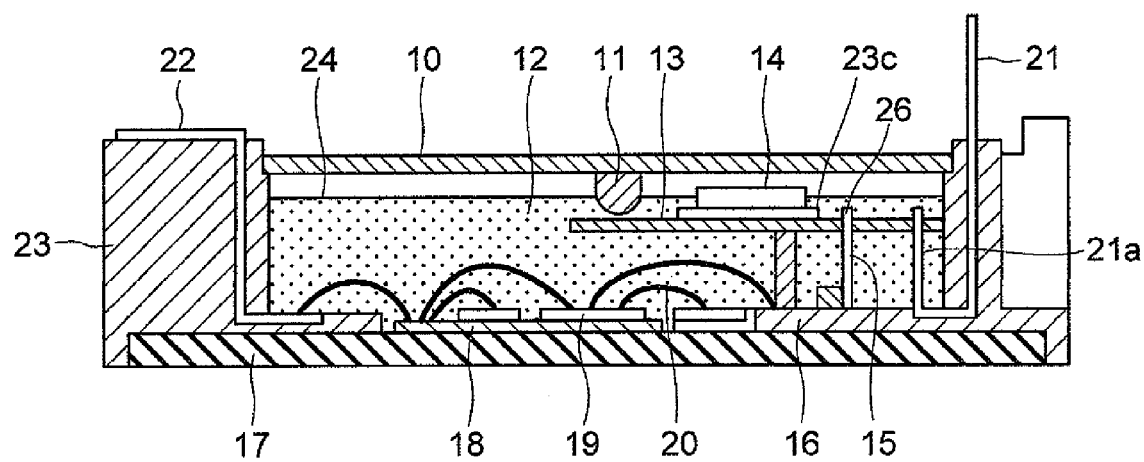
FIG. 18 is a sectional view showing the conventional power semiconductor module disclosed in the patent publication.

FIG. 17 is a graph showing relation between a ratio (d/b) of the distance d between the end of the printed board 102 and the inner wall of the case to the filling depth b of the silicone gel and the load Fc. The load Fc is normalized in the condition that the load FC is 1 when the ratio d/b=1.

As shown in FIG. 17, it was revealed by the inventors and the like that when d/b is equal to or less than 1, the load Fc shows the critical level, that is, the load Fc is shifted out of a constant value given when d/b is more than 1 and is going to rise. When defining the distance d between the end of the printed board 102 and the inner wall of the case 500, as shown in FIG. 17, the distance d is adjusted to be longer than the filling depth b of the silicone gel 101 under the printed board 102. This adjustment makes it possible to keep the load FC applied upward onto the printed board 102 substantially constant, which is suitable to preventing crack of the cover plate 105.

It should be further understood by those skilled in the art that although the foregoing description has been made on embodiments of the invention, the invention is not limited thereto and various changes and modifications may be made without departing from the spirit of the invention and the scope of the appended claims.

We claim:

1. A power semiconductor module comprising:
   a power circuit portion having a power semiconductor chip located on an upper surface of a base having a case on an outer periphery of the base;
   a printed board with a circuit component mounted thereon, located above the power circuit portion with a space therebetween; and
   silicone gel which is filled in the semiconductor module, wherein the printed board is sunk in said silicone gel, and
   wherein an elastic coefficient of at least a part of the printed board is smaller than an elastic coefficient of the cover plate,
   further including supporters which couple supporting portions of the printed board with a cover plate located on an upper portion of the case, extending from said cover plate, so that said printed board is transformable between said supporting portions of the printed board in response to a volume expansion of the silicone gel.

2. The power semiconductor module according to claim 1, wherein a thickness of at least a part of the printed board is thinner than a thickness of the cover plate.

3. The power semiconductor module according to claim 1, wherein the printed board is comprised of glass epoxy FR4, and the printed board is formed to have a thickness of 2 mm or less.

4. The power semiconductor module according to claim 1, wherein a relation of a/b≦1 is established, where a is a width of the printed board and b is a filling depth of the silicone gel under the printed board.

5. The power semiconductor module according to claim 1, wherein a gate wire of the power semiconductor chip is patterned on one of opposed sides of the printed board and an emitter wire is patterned on the other of the opposed sides thereof.

6. The power semiconductor module according to claim 1, wherein two wires between which a high voltage is applied are patterned on different ones of the printed boards.

7. A power semiconductor module according to claim 1, wherein a relation of d/b<1 is established, where b is a filling depth of the silicone gel under the printed board and d is a distance between an end portion of the printed board to a side wall of the case.

8. The power semiconductor module according to claim 1, wherein the printed board is supported by the supporter so that the printed board is movable in a longitudinal direction of the supporter.

9. The power semiconductor module according to claim 1, wherein wires led from the printed board are bonding wires.

10. The power semiconductor module according to claim 1, wherein 2 or its multiple number of semiconductor switching elements are mounted as the power semiconductor chips.

11. An inverter and converter system composed of plural semiconductor switching elements, comprising
   the semiconductor power module according to claim 1.

12. The power semiconductor module according to claim 1, wherein a gap is provided between the silicone gel and the cover plate when the silicone gel is filled in the semiconductor module.

13. A power semiconductor module comprising:
   a power circuit portion having a power semiconductor chip located on an upper surface of a base having a case on an outer periphery of the base;
   a printed board with a circuit component mounted thereon, located above the power circuit portion with a space therebetween; and
   silicone gel which is filled in the semiconductor module, wherein the printed board is sunk in said silicone gel, and
   wherein an elastic coefficient of at least a part of the printed board is smaller than an elastic coefficient of the cover plate,
   means for coupling supporting portions of the printed board with a cover plate located on an upper portion of the case, extending from said cover plate, so that said printed board is transformable between said supporting portions of the printed board in response to a volume expansion of the silicone gel.

* * * * *